(12) United States Patent
Ippoushi et al.

(10) Patent No.: US 8,061,412 B2
(45) Date of Patent: Nov. 22, 2011

(54) COOLING STRUCTURE, HEATSINK AND COOLING METHOD OF HEAT GENERATOR

(75) Inventors: Shigetoshi Ippoushi, Tokyo (JP); Akira Yamada, Tokyo (JP); Hirotoshi Maekawa, Tokyo (JP); Fumiharu Yabunaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1092 days.

(21) Appl. No.: 11/520,693

(22) Filed: Sep. 14, 2006

(65) Prior Publication Data

US 2007/0062674 A1 Mar. 22, 2007

(51) Int. Cl.
*F28F 7/00* (2006.01)
*H05K 7/20* (2006.01)

(52) U.S. Cl. ........................ 165/80.4; 165/185; 361/699

(58) Field of Classification Search ................. 165/80.4, 165/185, 104.33; 361/699, 700
See application file for complete search history.

(56) References Cited

U.S. PATENT DOCUMENTS

| | | | |
|---|---|---|---|
| 3,921,201 A * | 11/1975 | Eisele et al. ................... 257/714 |
| 3,984,861 A * | 10/1976 | Kessler, Jr. .................... 257/715 |
| 4,027,728 A * | 6/1977 | Kobayashi et al. ....... 165/104.27 |
| 4,572,286 A * | 2/1986 | Fujii et al. ................ 165/104.29 |
| 4,694,323 A * | 9/1987 | Itahana et al. ................. 257/715 |
| 4,704,658 A * | 11/1987 | Yokouchi et al. ............. 361/698 |
| 5,028,989 A * | 7/1991 | Naganuma et al. ............ 257/714 |
| 5,050,037 A * | 9/1991 | Yamamoto et al. ........... 361/699 |
| 5,150,274 A * | 9/1992 | Okada et al. .................. 361/703 |
| 5,168,348 A * | 12/1992 | Chu et al. ...................... 257/713 |
| 5,212,625 A | 5/1993 | Van Andel et al. |
| 5,315,480 A * | 5/1994 | Samarov et al. .............. 361/705 |
| 5,316,077 A * | 5/1994 | Reichard ................... 165/104.28 |
| 5,365,402 A * | 11/1994 | Hatada et al. ................. 361/699 |
| 5,959,351 A * | 9/1999 | Sasaki et al. .................. 257/714 |
| 5,978,220 A * | 11/1999 | Frey et al. ...................... 361/699 |
| 6,000,603 A * | 12/1999 | Koskenmaki et al. ........ 228/246 |
| 6,055,154 A * | 4/2000 | Azar .............................. 361/688 |
| 6,059,024 A * | 5/2000 | Ramshaw et al. ............. 165/166 |
| 6,084,771 A * | 7/2000 | Ranchy et al. ................ 361/699 |
| 6,257,320 B1 * | 7/2001 | Wargo .......................... 165/80.4 |
| 6,351,384 B1 * | 2/2002 | Daikoku et al. .............. 361/704 |
| 6,367,541 B2 * | 4/2002 | McCullough ................ 165/80.3 |
| 6,496,367 B2 * | 12/2002 | Donahoe et al. ......... 361/679.46 |
| 6,867,973 B2 * | 3/2005 | Chang ........................... 361/699 |
| 6,919,504 B2 * | 7/2005 | McCutcheon et al. ........ 174/16.3 |
| 6,992,887 B2 * | 1/2006 | Jairazbhoy et al. ........... 361/689 |
| 7,007,741 B2 * | 3/2006 | Sen et al. ......................... 165/46 |
| 7,077,858 B2 * | 7/2006 | Fletcher et al. ............... 607/104 |
| 7,190,580 B2 * | 3/2007 | Bezama et al. ............... 361/699 |
| 7,254,030 B2 * | 8/2007 | Chiba et al. ................... 361/710 |
| 7,399,919 B2 * | 7/2008 | McCutcheon et al. ........ 174/16.3 |

(Continued)

FOREIGN PATENT DOCUMENTS

JP 5-63385 3/1993

(Continued)

*Primary Examiner* — Cheryl J Tyler
*Assistant Examiner* — Brandon M Rosati
(74) *Attorney, Agent, or Firm* — Oblon, Spivak, McClelland, Maier & Neustadt, L.L.P.

(57) ABSTRACT

A cooling structure includes a heat dissipation structure having a heat generator and a heatsink that is adhered through an insulating adhesive layer to at least a surface of the heat generator that faces a cooling fluid and made of a metal foil having the flexibility; and a fluid flow path that is disposed outside of the heat dissipation structure so that the cooling fluid flowing inside thereof and the heatsink may directly come into contact. Furthermore, on a surface of the heatsink that directly comes into contact with the cooling fluid, a fine recess is disposed.

6 Claims, 11 Drawing Sheets

U.S. PATENT DOCUMENTS

| | | | |
|---|---|---|---|
| 7,593,228 B2 * | 9/2009 | Jarrett et al. | 361/704 |
| 2005/0072559 A1 * | 4/2005 | Ippoushi et al. | 165/104.13 |
| 2005/0083655 A1 * | 4/2005 | Jairazbhoy et al. | 361/699 |

FOREIGN PATENT DOCUMENTS

| | | | | |
|---|---|---|---|---|
| JP | 7-507658 | | 8/1995 | |
| JP | 9-121557 | | 5/1997 | |
| JP | 11-504767 | | 4/1999 | |
| JP | 2003-324173 | | 11/2003 | |
| JP | 2005-166578 | | 6/2005 | |
| JP | 2005-244014 | * | 9/2005 | 165/80.4 |
| WO | WO 93/24955 | | 12/1993 | |
| WO | WO 97/31512 | | 8/1997 | |
| WO | WO 99/66282 | | 12/1999 | |

\* cited by examiner

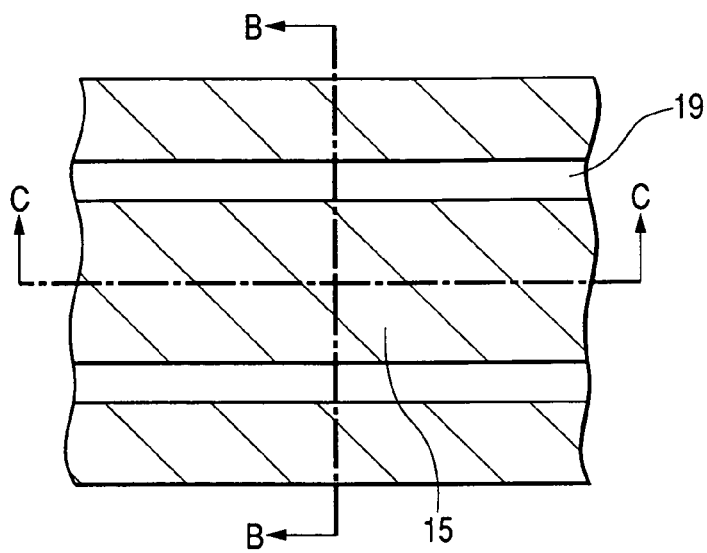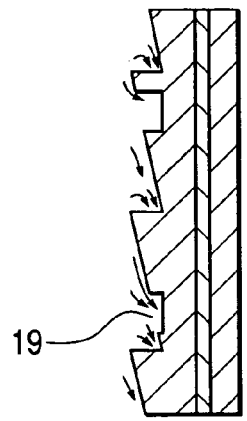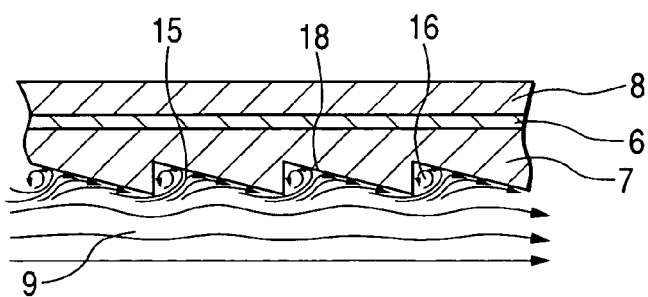

COOLING STRUCTURE, HEATSINK AND COOLING METHOD OF HEAT GENERATOR

BACKGROUND

1. Technical Field

The present invention relates to a cooling structure for cooling a heat generator constituted of electronic parts and a heatsink. Furthermore, the invention relates to a cooling method of the heat generator.

The cooling structure indicates a cooling structure that cools heat generated by a heat generator with a cooling fluid and includes a heat generator and a fluid flow path through which the cooling fluid flows. The heatsink indicates a structure that thermally couples with the heat generator and directly comes into contact with the cooling fluid to heat exchange with the cooling fluid to dissipate the heat of the heat generator to the cooling fluid.

2. Description of Related Art

An existing cooling structure has a configuration where a heat generator is disposed to a heatsink that includes, for instance, a cooling fluid intake port, a heat transfer vessel provided with a flow path therein and a cooling fluid output port, and, when the cooling fluid is flowed in the flow path inside of the heat transfer vessel, the heat generator is cooled. Furthermore, in one configured like this, in order to promote the cooling, a heat transfer promoter (fin and turbulence promoter) is disposed inside of the flow path to advance the heat transfer.

Furthermore, a cooling structure where to a cooling fluid flowing vessel that is provided with a cooling fluid intake port and a cooling fluid output port and inside of which a flow path communicating with the intake port and output port is formed, an aperture is disposed to communicate the inside of the flow path and a circumference thereof, and an insulating substrate (substrate that is mainly disposed to electrically isolate and to hold and fix electronic components mounted) on which a heat generator is disposed to cover the aperture to seal is proposed (JP-A-09-121557 (page 1, FIG. 1)). In a cooling structure like this, the cooling fluid that flows the flow path cools the insulating substrate and the heat generator is cooled through the insulating substrate.

SUMMARY

As mentioned above, since in an existing cooling structure a heat generator is attached to a heat transfer vessel or on an insulating substrate, the contact thermal resistance is generated between the heat transfer vessel or the insulating substrate and the heat generator to be poor in the heat dissipation characteristics. Furthermore, there is a problem as well in that the long-term reliability of a thermal grease that is coated to decrease the contact thermal resistance between the heat transfer vessel or the insulating substrate and the heat generator is poor.

Still furthermore, in the case of the heat generator being an electronic component, since a volume and a weight of an insulating substrate disposed to the heat generator to obtain an electrically insulating structure are large and the thermal resistance increases as a result of the attachment of the insulating substrate, there is a problem in that the heat dissipation characteristics are deteriorated. Furthermore, there is still another problem in that the heatsink per se is large in volume and weight.

Furthermore, in an existing heatsink, a heat transfer promoter is disposed in a flow path to promote the heat transfer. However, since an increase rate of the pressure loss due to the disposition of the heat transfer promoter is larger than an effect of improving the heat transfer of the heat transfer promoter, a higher output pump is necessary. Accordingly, there is a problem in that a cooling structure becomes larger in the power consumption, more expensive and larger in volume and weight.

Still furthermore, since the pressure loss becomes larger, pressure in the flow path goes up to be larger in difference with that of a periphery; accordingly, the pressure resistance of the heatsink and an accompanying piping has to be improved, thicknesses of the heatsink and the piping that form the flow path have to be increased, resulting in becoming larger in volume and weight. Furthermore, there is a problem in that the sealing characteristics of a connecting portion have to be more improved.

The invention is carried out to overcome these problems and intends to provide a cooling structure that is lightweight and compact and excellent in the heat dissipation characteristics and a cooling method.

Furthermore, the invention intends to provide, without making a weight and a volume of a heatsink larger, a heatsink excellent in the heat dissipation characteristics and thereby to realize a cooling structure that is lightweight and compact and excellent in the heat dissipation characteristics.

According to an aspect of the invention, a cooling structure that cools heat generated from a heat generator with a cooling fluid, the cooling structure comprising: a heat dissipation structure including: a heat generator comprising a semiconductor element; a first heat spreader and a second heat spreader disposed on opposite surfaces of the semiconductor element; a first heat sink attached to a surface of the first heat spreader on a side of the first heat spreader opposite to the semiconductor element, the first heat sink including a first flexible metal foil and adhered to the first heat spreader via a first insulating adhesive layer, the first flexible metal foil being impermeable to the cooling fluid; a second heat sink attached to a surface of the second heat spreader on a side of the second heat spreader opposite to the semiconductor element, the second heat sink including a second flexible metal foil and adhered to the second heat spreader via a second insulating adhesive layer, the second flexible metal foil being impermeable to the cooling fluid; and a flow path structure disposed outside of the heat dissipation structure, the flow path structure comprising: a first fluid flow path disposed on a side of the first heat sink opposite to the semiconductor element so that the cooling fluid flowing inside the first fluid flow path and the first heat sink directly come into contact; and a second fluid flow path disposed on a side of the second heat sink opposite to the semiconductor element so that the cooling fluid flowing inside the second fluid flow path and the second heat sink directly come into contact, the first fluid flow path and the second fluid flow path both including a cooling fluid intake port, a cooling fluid flow path vessel provided with a flow path inside thereof, an aperture, and a cooling fluid output port, wherein the heat dissipation structure is disposed so that the first heat sink covers the aperture of the first fluid flow path and the second heat sink covers the aperture of the second fluid flow path, wherein no further heat generator is positioned between said heat generator comprising a semiconductor element and either of said first heat spreader and said second heat spreader.

Furthermore, according to another aspect of the invention, a fine recess intersects with a flow direction of the cooling fluid is disposed on a surface of the heatsink that directly comes into contact with the cooling fluid. When viewed from a cross section of the fine recess along the flow direction of the cooling fluid, the fine recess is asymmetry.

Still furthermore, according to another aspect of the invention, a fine recess intersects with a flow direction of the cooling fluid is disposed on a surface of the heatsink that directly comes into contact with the cooling fluid.

Furthermore, according to another aspect of the invention, in a cooling method of a heat generator, on a surface of the heat generator, a heat dissipation structure where a heatsink made of a metal foil having the flexibility is adhered through an insulating adhesive layer is disposed in a fluid flow path therethrough the cooling fluid flows so that the heatsink may directly come into contact with the cooling fluid.

In a cooling structure and cooling method according to the above-aspects, since a heatsink made of a metal foil having the flexibility is adhered through an insulating adhesive layer to a surface of a heat generator and a heat dissipation structure having such a configuration is disposed in a fluid flow path so that a cooling fluid and the heatsink may directly come into contact, a cooling structure that is lightweight and compact and excellent in the heat dissipation characteristics can be obtained.

Furthermore, since a heatsink according to the above-aspects is configured with a fine recess asymmetrically formed in cross section along a flow direction of the cool fluid and extending along a direction intersecting with the flow direction or a fine recess disposed on a surface of the heatsink in contact with the cooling fluid and having a portion where an flow area of the cool fluid changes large and a portion where an flow area of the cool fluid changes small, a heatsink that is less in the pressure loss and excellent in the heat dissipation characteristics can be provided.

BRIEF DESCRIPTION OF DRAWINGS

FIGS. 8A through 8C are configurational diagrams schematically showing another cooling structure according to the embodiment 3 of the invention.

DESCRIPTION OF THE EMBODIMENTS

Embodiment 1

Figure 1:
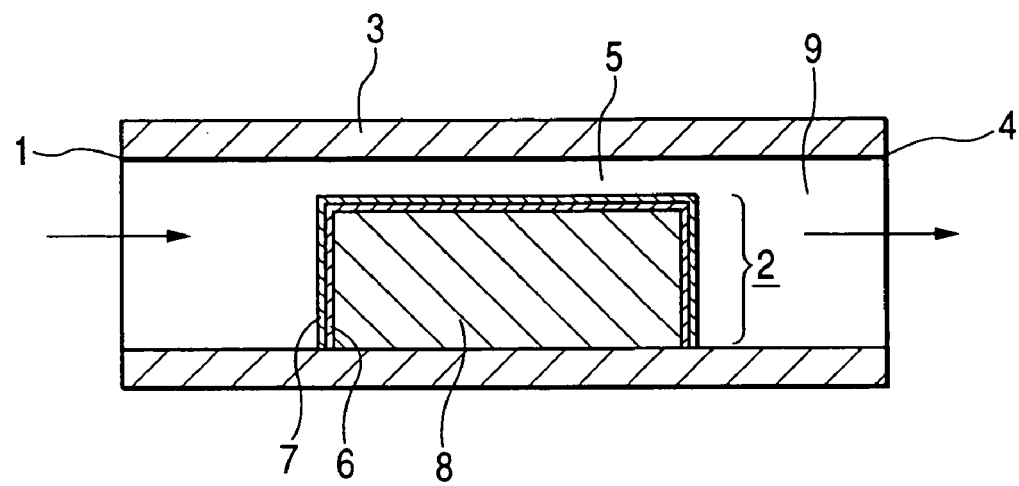
FIG. 1 is a sectional configurational diagram schematically showing a cooling structure according to an embodiment 1 of the invention.

FIG. 1 is a sectional configurational diagram schematically showing a cooling structure according to embodiment 1 of the invention.

The cooling structure shown in FIG. 1 is constituted with a heat dissipation structure 2 disposed in a sequence of a fluid flow path 5 formed of a cooling fluid intake port 1 through which a low temperature cooling fluid (cooling medium) 9 is fed in, a cooling fluid flow vessel 3 in which a flow path is formed and a cooling fluid output port 4. The heat dissipation structure 2 is constituted including a heat generator 8 and a heatsink 7 that is made of a metal foil having the flexibility adhered through an insulating adhesive layer 6 to a surface of the heat generator 8 that faces a cooling fluid 9.

To the cooling structure having such a configuration, a pump is connected with a fluid flow tube (circular tube, rectangular tube, flexible tube and hose) to flow the cooling fluid 9 to externally dissipate heat generated from the heat generator 8 (open cooling system). Alternatively, a fluid flow tube connects a heat dissipater and the cooling structure to form a circulating fluid flow loop, thereby the cooling fluid 9 is circulated inside of the fluid flow loop to transport heat generated from the heat generator 8 to the heat dissipater, and the heat dissipater externally dissipates the heat (circulating cooling system). Furthermore, at this time, in the middle of the fluid flow loop, a reservoir and a filter may be disposed to form a circulating cooling system.

Furthermore, in each of the cooling systems, to a fluid flow tube or a fluid flow loop, a plurality of cooling structures may be directly or through a fluid flow tube connected in series. Still furthermore, a plurality of cooling structures may be connected in parallel through a distribution header and a confluent header. At this time, a distribution header and a confluent header may be inside of the cooling fluid flow vessel 3.

The cooling structure shown in FIG. 1 is configured with the heat generator 8 disposed in the fluid flow path 5. However, without restricting thereto and though omitted from showing in the drawings for instance, the heat generator 8 to which the heatsink 7 made of a metal foil is adhered through the insulating adhesive layer 6 may be submerged in a river or sea to dissipate heat to circumferential running water. In this case, the river or sea corresponds to the fluid flow path and river water or seawater becomes the cooling fluid.

Furthermore, in the cooling structure shown in FIG. 1, the heat generator 8 may be wired. At this time, an aperture may be disposed to the heatsink 7 made of the metal foil to dispose a waterproof wiring takeoff port.

Figure 2:
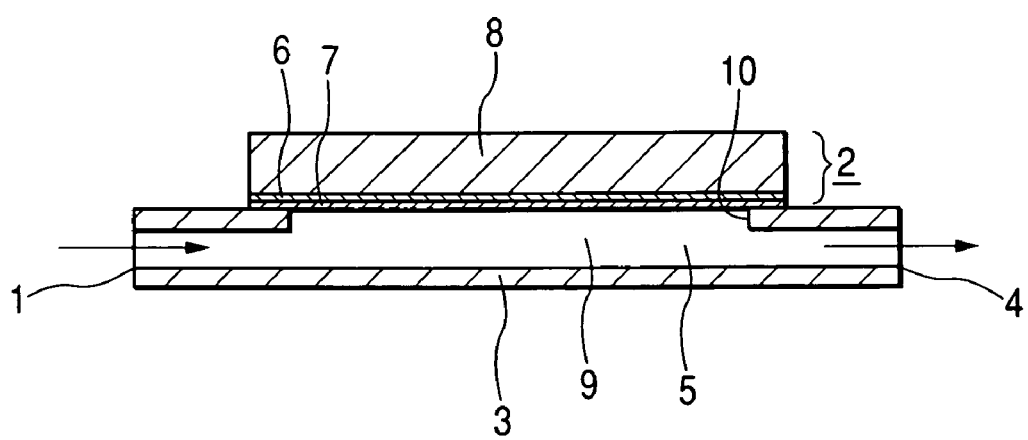
FIG. 2 is a sectional configurational diagram schematically showing another cooling structure according to an embodiment 1 of the invention.

FIG. 2 is a sectional configurational diagram schematically showing another cooling structure according to embodiment 1 of the invention.

In the cooling structure shown in FIG. 2, an aperture 10 is disposed on a top surface of a cooling fluid flow vessel 3 and, with a heatsink 7 of a heat dissipation structure 2 that is larger than the aperture 10, the aperture 10 is covered and sealed.

In FIG. 2, an example where the aperture 10 is covered with a plane portion of the heat dissipation structure 2 is shown. A heat dissipation structure partially projected from the aperture 10 or a heat dissipation structure having a recess may be used to cover the aperture 10.

In the cooling structure shown in FIG. 2, as a sealing structure of the aperture 10, a configuration that solidly fixes (adhesion or welding) the vessel 3 and the heatsink 7 may be adopted or a configuration where pressure welding is applied through an O-ring or a gasket may be adopted. As far as the cooling fluid 9 can be inhibited from leaking, the sealing structure is not particularly restricted.

The heatsink 7 may have such a shape that the heatsink 7 can seal a whole of the aperture 10. By thus configuration, the cooling fluid does not contact with the insulating adhesive layer 6, so that a leakage of the cooling fluid 9 and a peeling-off of the insulating adhesive layer 6 can be avoided.

In the next place, an operation of the cooling structure shown in FIGS. 1 and 2 will be described. A low temperature cooling fluid 9 fed from a cooling fluid intake port 1 to a flow path goes through the flow path and is sent out of a cooling liquid output port 4. At that time, a heatsink 7 thermally coupled through an insulating adhesive layer 6 with a heat generator 8 is heated by heat from the heat generator 8 and generates temperature difference between the cooling fluid 9 and the heatsink 7. Since the heatsink 7 is disposed so as to directly come into contact with the cooling fluid 9 in the flow path, the heat is transmitted from the heatsink 7 to the cooling fluid 9, the cooling fluid 9 is heated to a high temperature and the high temperature cooling fluid 9 is sent out of the cooling fluid output port 4. Thus, the cooling fluid 9 goes sequentially through the cooling fluid intake port 1, a flow path in the cooling fluid flow vessel 3 and the cooling liquid output port 4 to be heated to a high temperature during passing through the flow path and the high temperature cooling fluid 9 is continuously sent out.

In the cooling structure according to the embodiment, on a surface of the heat generator 8 that faces the cooling fluid 9, the heatsink 7 made of a flexible metal foil is adhered through an insulating adhesive layer 6 to form a heat dissipation structure 2. The insulating adhesive layer 6 not only insulates electrically the heatsink 7 and the heat generator 8 but also physically and thermally couples the heatsink 7 and the heat generator 8. Furthermore, the insulating adhesive layer 6, being a resin, may swell upon coming into contact with the cooling fluid 9; however, the heatsink 7, being made of the metal foil, does not swell upon coming into direct contact with the cooling fluid 9. Furthermore, since the heatsink 7 is flexible, it can be disposed covering the insulating adhesive layer 6 so that the cooling fluid 9 and the heat generator 8 may not directly come into contact; accordingly, the insulating adhesive layer 6 can be waterproofed. Accordingly, when a thus configured heat dissipation structure 2 is, as shown in FIG. 2, disposed in the fluid flow path 5 therethrough the cooling fluid 9 flows, alternatively, as shown in FIG. 2, in the fluid flow path 5 having an aperture 10, when the heatsink 7 is disposed so as to cover the aperture 10, the contact resistance generated between the heat generator 8 and the cooling fluid 9 can be made smaller. As a result, a cooling structure excellent in the heat dissipation characteristics and long-term reliability can be obtained. Furthermore, a lightweight and compact cooling structure can be provided.

Still furthermore, since the heatsink 7 is made of a flexible metal foil, even when an adhesion surface of the heat generator 8 is not planar, such as protruded plane, recessed plane, steps, curved surface, the heatsink 7 can be readily attached.

As exemplary shown in FIG. 1, a plurality of planes can be used as "heat transfer plane (five planes in FIG. 1)."

The heat generator 8 in the embodiment 1 is, for instance, a heater, a heat generation source of an electronic device or an electronic part, or a heat generation source obtained by integrating these, or a heat dissipation portion or heat exchanger of a unit that transports heat from the heat generation source. The heat generator 8, as far as it can input heat through the insulating adhesive layer 6 to the heatsink 7, is not particularly restricted in the structure and dimension thereof. In particular, it may not be a structure where the electrical insulation is secured.

The insulating adhesive layer 6, as mentioned above, physically and solidly fixes the heat generator 8 and the heatsink 7 and plays a role of thermally coupling the heat generator 8 and the heatsink 7 and a role of electrically insulating the heat generator 8 and the heatsink 7. As a specific material thereof, for instance, a highly thermally conductive/electrical insulative adhesive where filler such as metal fibers or powders are blended in an epoxy resin adhesive is desirable.

Furthermore, a thickness of the insulating adhesive layer 6 is preferably 300 µm or less and the thermal conductivity of the adhesive used is preferably 0.5 W/(m·K) or more. When the thickness is larger than this and the thermal conductivity is smaller than this, the thermal resistance of the insulating adhesive layer 6 becomes excessively large to deteriorate the heat dissipation characteristics. Preferably, the thickness of the insulating adhesive layer 6 is 150 µm or less and the thermal conductivity of the adhesive is 2 W/(m·K) or more.

On the other hand, as the electrical insulating characteristics of the adhesive used is necessary to be $10^{12}$ Ω/cm or more in the volume resistance and 10 kV/cm or more in the breakdown voltage. Preferably, the volume resistance is $10^{13}$ Ω/cm or more and the breakdown voltage is 100 kV/cm or more. Furthermore, the higher the values are, the better and the more preferable the withstand voltage characteristics are.

The heatsink 7 is a flexible metal foil and, as mentioned above, plays a role of inhibiting the cooling fluid 9 from leaking and a role of dissipating heat through the insulating adhesive layer 6 from the heat generator 8 to the cooling fluid 9. A material of the heatsink 7 is a metallic material such as copper or aluminum and, in particular, when a flow speed of the cooling fluid 9 is large, a material excellent in the anti-erosion and anti-corrosion characteristics such as stainless or titanium is preferable. Furthermore, a plurality of different metal foils may be layered or, still furthermore, a surface of a metal foil may be processed to form an alumite coating or a boehmite coating.

Furthermore, a thickness of the heatsink 7 is preferably 1.5 mm or less. When the thickness is larger than this, the heatsink 7 is deteriorated in the flexibility to be difficult to adhere the heatsink 7 to the heat generator 8. In particular, upon adhering, voids remain in the insulating adhesive layer 6 to deteriorate the heat dissipation characteristics much. Still furthermore, when the linear expansion coefficients of materials of the heatsink 7 and the heat generator 8 are largely different, since the difference of amounts of expansion of the respective members generated during the heat cycle is large, owing to the thermal stress caused by the difference, the insulating adhesive layer 6 is peeled to largely deteriorate the heat dissipation characteristics. The smaller the thickness of the heatsink 7 is, the smaller the thermal stress becomes (the thermal stress can be alleviated). When the above condition is satisfied, the heat cycle resistance can be improved. The thickness of the heatsink 7 is preferably 500 μm or less.

The cooling fluid flow vessel 3 has a flow path formed inside thereof and plays a role of accommodating the cooling fluid 9 and of a flow path through which the cooling fluid 9 moves. As shown in FIG. 2, the cooling fluid flow vessel 3 may be provided with at least one aperture 10 and at that time the heatsink 7 adhered through the insulating adhesive layer 6 to the heat generator 8 covers the aperture 10 and seals. Thereby, the cooling fluid flow vessel 3 plays a role of accommodating and moving the cooling fluid 9.

In order to promote the heat transfer from the heatsink 7 to the cooling fluid 9, a heat transfer promoter may be disposed inside of the flow path. In that case, the heat transfer promoter is a fin that thermally couples with the heatsink 7, expands a heat transfer surface area and improves the heat transfer owing to the turbulence promotion, the fin being constituted of a substantially planar or substantially columnar protrusion or inner fin. Furthermore, the heat transfer promoter indicates a turbulence promoter that has a heat transfer improvement effect owing to the turbulence promotion and indicates variously shaped projections disposed on a flow path wall facing a surface thereto the heat generator 8 is attached and inserts such as a substrate having a ribbon, a coil or variously shaped projections or a substrate having a plurality of apertures.

When the aperture 10 is disposed as shown in FIG. 2, since a fluid flow sectional area of a flow path of the aperture 10 is large, the flow speed is lowered to deteriorate the heat dissipation characteristics; accordingly, a configuration where, while securing an appropriate flow path, a flow path wall that faces the aperture 10 projects is preferable.

The flow path may be a sequence of meandering flow paths or parallel flow paths accompanying a distribution header and a confluent header. The flow path, as far as it allows the cooling fluid 9 to move therein, is not restricted particularly in the structure, shape and dimension.

Furthermore, in the aperture 10 disposed to the cooling fluid flow vessel 3, two or more flow paths may be formed. For instance, the flow path in the aperture 10 may be divided with a partition plate and in each of the flow paths the cooling fluid 9 may be counter-flowed to the other.

The cooling fluid intake port 1 plays a role of feeding a low temperature cooling fluid 9. On the other hand, the cooling fluid output port 4 plays a role of outputting a high temperature cooling fluid 9. These are normally connected with the fluid flow tube (round tube, rectangular tube, flexible tube or hose). In connection portions between each of the cooling fluid intake port 1 and the cooling fluid output port 4 and the fluid flow path, the fluid flow tube may be fastened thereto, the fluid flow tube may be integrated therewith to be one body, a fluid flow tube with nipple may be fastened thereto, or an O-ring or a gasket may be used to connect the fluid flow tube and a similar cooling fluid flow vessel 3. As far as the cooling fluid 9 can be fed and outputted, there is no restriction on the structure thereof.

A material that constitutes the cooling fluid flow vessel 3, as far as it is a material that can accommodate the cooling fluid 9, may be a resin such as PPS (polyphenylene sulfide), a metal such as aluminum, copper or stainless or a composite material mainly made of these.

Furthermore, the cooling fluid flow vessel 3 may be constituted of a plurality of parts.

Still furthermore, when the cooling fluid flow vessel 3 is partially formed of a resinous material, a metal plate (for instance, stainless plate) may be partially disposed on a surface thereof. When thus formed, the resinous material can be inhibited from deforming with time. In particular, when the heat generator 8 or a jig that fastens the heat generator 8 and the metal plate sandwich the cooling fluid flow vessel 3 to fasten, an advantage thereof is large. At that time, a spring structure that uses a plate spring can be preferably used to fasten.

The metal plate may be partially exposed in the flow path so as to come into contact with the cooling fluid 9. When thus disposed, an insulation (withstand voltage) test can be readily applied when an electronic device is disposed as the heat generator 8.

The metal plate has only to be disposed to the cooling fluid flow vessel 3. The dimension and an attachment method thereof are not particularly restricted. A fastening jig such as a bolt may be used to fasten or welding or adhesion may be used to fasten. Furthermore, when the metal plate is partially exposed in the flow path, a structure that can inhibit the cooling fluid 9 from leaking from the exposed portion is necessary; accordingly, the metal plate may be tightly adhered through an O-ring or a gasket.

The cooling fluid 9 is a liquid such as distilled water, antifreeze liquid, oil, liquefied carbon dioxide alcohol and ammonia. The cooling fluid 9A may be a liquid that boils on a surface of the heatsink, and a gus such as air.

According to the embodiments of the invention, a insulating adhesive layer 6 electrically insulates heat dissipation structure 2 from the heatsink 7, so that any cooling fluid having good heat fluid characteristic can be used. The cooling fluid 9 is not limited to a cooling fluid having a high electrical insulating property.

As a method of fastening between cooling fluid flow vessel 3 and the heat generator 8, a jig such as a bolt and nut may be used to fasten or a spring structure that uses a plate spring may be used to fasten. As far as the cooling fluid flow vessel 3 and the heat generator 8 can be fastened, a structure thereof is not particularly restricted.

Example 2

Figure 3:
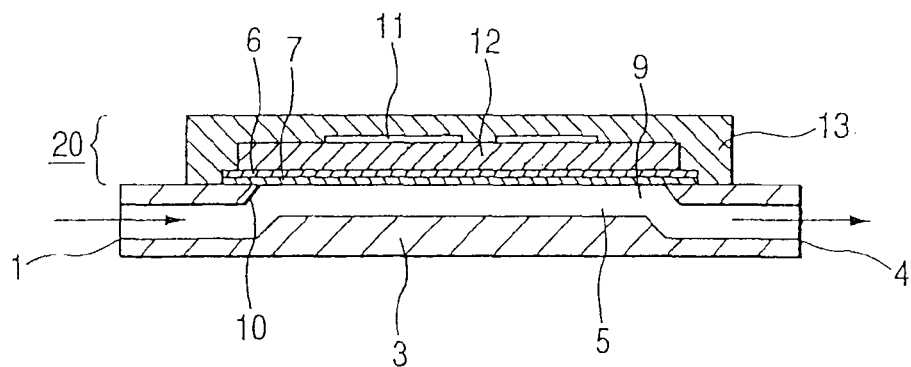
FIG. 3 is a sectional configurational diagram schematically showing a cooling structure according to an embodiment 2 of the invention.

FIG. 3 is sectional configurational diagram schematically showing a cooling structure according to embodiment 2 of the invention.

The embodiment 2 is one where the heat generator 8 according to the embodiment 1 is more specified and constituted of, as shown in FIG. 3, a semiconductor element 11 and a heat spreader 12 disposed on one surface of the semiconductor element 11. To such a heat generator, on a heat spreader surface on a side opposite to the semiconductor element 11, through an insulating adhesive layer 6, a heatsink 7 made of a flexible metal foil is adhered to form a heat dissipation structure 2.

The heat spreader 12 plays a role of fastening the semiconductor element 11, a role of energizing from or to the semiconductor element 11 and a role of thermally diffusing heat generated at the semiconductor element 11 and transmitting the heat through an insulating adhesive layer 6 to the heatsink 7 and is made of metal. Preferably, the heat spreader 12 is desirably formed of copper high in the thermal conductivity or an alloy mainly made of copper.

The semiconductor element 11, with a bottom surface of the semiconductor element 11 and a top surface of the heat spreader 12 coupled physically, thermally and electrically (for instance, soldering), on the other hand, with a not shown electrode and a top surface of the semiconductor element 11 coupled electrically (coupled through, for instance, an aluminum wire or a solder bump), plays a role of electrically coupling or not coupling between the electrode and the heat spreader 12. Accordingly, as far as a desired function (for instance, a function of converting an alternating current to a direct current or a direct current to an alternating current) can be obtained when a current is energized between the electrode and the heat spreader 12 to control the semiconductor element 11, semiconductor elements such as IGBT or Diode can be cited.

Between the semiconductor element 11 and the heat spreader 12, one or a plurality of intervening matters (for instance, a substrate) may be disposed.

In the heat dissipation structure according to embodiment 2, the semiconductor element 11 has only to be disposed on a top surface of the heat spreader 12, the heatsink 7 has only to be adhered to a bottom surface of the heat spreader 12 and other configurations are not particularly restricted. For instance, though omitted from showing in the drawing, a control element different from the semiconductor element 11, a gate electrode or a sensor element may be disposed on the heat spreader 12 or thereabove or sideward thereof.

Furthermore, with the heat spreader 12 partially exposed and with the members (semiconductor element, heat spreader, electrode, control element different from the semiconductor element, gate electrode and sensor element) collectively resin-molded, after that, a heatsink 7 may be adhered thereto, alternatively, after the heatsink 7 is previously adhered to the heat spreader 12, the members may be resin molded so as to at least partially expose the heatsink 7. In FIG. 3, a reference numeral 13 expresses a resin mold.

Hereinafter, a structure constituted of at least the heatsink 7, the insulating adhesive layer 6, the heat spreader 12 and the semiconductor element 11 is expressed as a single-sided heat dissipation structure 20.

In the cooling structure shown in FIG. 3, the single-sided heat dissipation structure 20 having the above configuration is disposed to the cooling fluid flow vessel 3 provided with an aperture 10 constituted similarly to that of FIG. 2, the heatsink 7 of the single-sided heat dissipation structure 20 being disposed so as to cover the aperture 10. The heatsink 7 is a heatsink 7 larger than the aperture 10.

In the next place, an operation of the cooling structure will be described. A low temperature cooling fluid 9 (cooling medium) fed from the cooling fluid intake port 1 to a flow path, while flowing through the flow path, comes into contact with the heatsink 7 of the single-sided heat dissipation structure 20 and is outputted from the cooling fluid output port 4. At that time, when a current is flowed between the heat spreader 12 and the electrode to control the semiconductor element 11, the semiconductor element 11 plays a desired role and, at the same time, heat generated from electric loss is transmitted through the heat spreader 12 and the insulating adhesive layer 6 to the heatsink 7. Upon receiving the heat, the heatsink 7 is heated to generate temperature difference between the cooling fluid 9 and the heatsink 7. Since the heatsink 7 is disposed so as to come into contact directly with the cooling fluid 9 in the flow path, the heat is transmitted from the heatsink 7 to the cooling fluid 9 to heat the cooling fluid 9 to a higher temperature, and a high temperature cooling fluid 9 is outputted from the cooling fluid output port 4. Thus, the cooling fluid 9 circulates sequentially the cooling fluid intake port 1, a flow path inside of the cooling fluid flow vessel 3 and the cooling fluid output port 4, receives heat from the single-sided heat dissipation structure 20 during going through the flow path to be heated to a high temperature, and the high temperature cooling fluid 9 is continuously outputted.

In the cooling structure according to the embodiment shown in FIG. 3 as well, similarly to embodiment 1, a cooling structure where the contact resistance generated between the semiconductor element 11 and heat spreader 12 and the cooling fluid 9 can be made smaller and that is excellent in the heat dissipation characteristics and the long-term reliability can be obtained. Furthermore, a lightweight and compact cooling structure can be provided.

Figure 4:
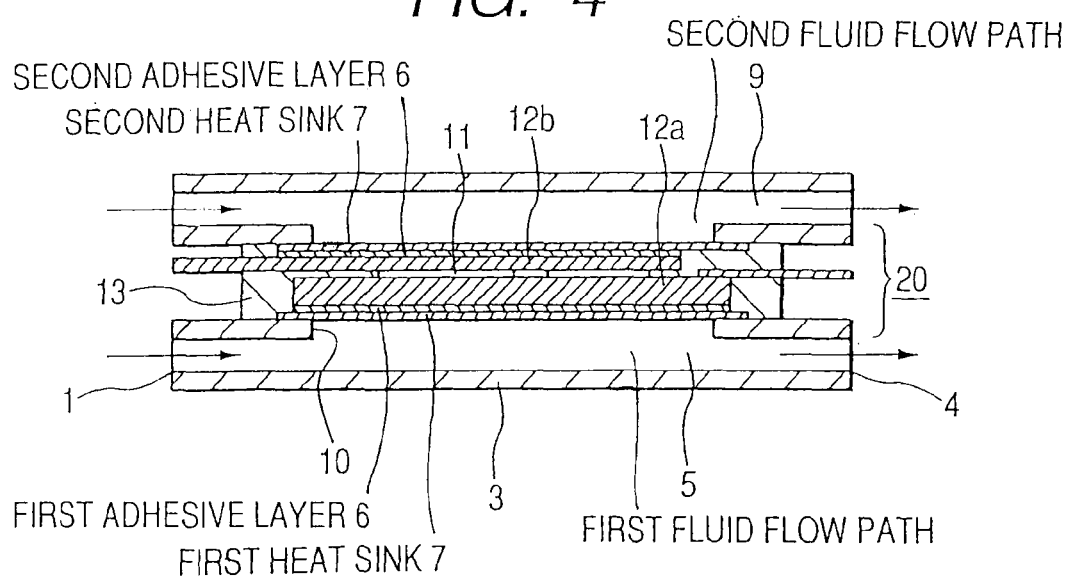
FIG. 4 is a sectional configurational diagram schematically showing another cooling structure according to an embodiment 2 of the invention.

FIG. 4 is a sectional configurational diagram schematically showing another cooling structure according to embodiment 2 of the invention.

In FIG. 4, a heat dissipation structure 20 includes a semiconductor element 11 and two heat spreaders 12a and 12b each of which is disposed on one of both surfaces of the semiconductor element 11 and on a surface on a side opposite to the semiconductor element 11 of which a heatsink 7 made of a flexible metal foil is adhered through an insulating adhesive layer 6. In the heat dissipation structure 20 shown in FIG. 4, an electrode (omitted from showing in the drawing) of the heat dissipation structure 20 shown in FIG. 3 is disposed on a top surface of the semiconductor element 11 as the heat spreader 12b, a lower heat spreader being called a first heat spreader 12a and an upper electrode being called a second heat spreader 12b. The first heat spreader 12a is one similar to the heat spreader 12 shown in FIG. 3.

The second heat spreader 12b corresponds to the electrode, plays a role of diffusing heat generated by the semiconductor element 11 and transmitting the heat through the insulating adhesive layer 6 to the heatsink 7 and is made of metal. Similarly to the first heat spreader 12a, preferably, the second heat spreader 12b is desirably made of copper high in the thermal conductivity and an alloy mainly made of copper. The second heat spreader 12b, different from the first heat spreader 12a, is not necessary to carry a role of fastening the semiconductor element 11. Accordingly, the second heat spreader 12b is not necessarily physically coupled with the semiconductor element 11. As a result, the second heat spreader 12b and the semiconductor element 11 may be directly or through an intervening matter (for instance, solder bump) brought into contact to establish electrical and thermal coupling, alternatively, the second heat spreader 12b may physically couple with the semiconductor element 11 similarly to the first heat spreader 12a. As to other respective members and configurations are same as the description of FIG. 3.

In what follows, a structure including at least a heatsink 7, an insulating adhesive layer 6, a first heat spreader 12a, a second heat spreader 12b and a semiconductor element 11 is described as a double-sided heat dissipation structure 20.

In the cooling structure shown in FIG. 4, on each of both sides of the above-configured double-sided heat dissipation structure 20, a fluid flow path 5 made of a cooling fluid intake port 1, a cooling fluid flow vessel 3 provided with a flow path formed therein and an aperture 10 and a cooling fluid output port 4 is disposed, each of the heatsinks 7 of the double-sided heat dissipation structure 20 being disposed so as to cover the aperture 10 of each of the fluid flow paths 5. The heatsink 7 is a heatsink 7 larger than the aperture 10.

In the next place, an operation of the cooling structure will be described. In each of the fluid flow paths 5, a low temperature cooling fluid 9 (cooling medium) fed from the cooling fluid intake port 1 to a flow path, while flowing through the flow path, comes into contact with each of the heatsinks 7 of the double-sided heat dissipation structure 20 and is outputted from the cooling fluid output port 4. At that time, when a current is flowed between the first heat spreader 12a and the second heat spreader 12b to control the semiconductor element 11, the semiconductor element 11 plays a desired role and, at the same time, heat generated from electric loss is transmitted through each of the heat spreaders 12a and 12b and the insulating adhesive layer 6 to each of the two heatsinks 7. Upon receiving the heat, the respective heatsinks 7 each are heated to generate temperature difference between the cooling fluid 9 in the flow path and the heatsink 7. Since the heatsinks 7 each are disposed so as to directly come into contact with the cooling fluid 9 in the flow path, the heat is transmitted from the heatsink 7 to the cooling fluid 9 to heat the cooling fluid 9 to a higher temperature, and a high temperature cooling fluid 9 is outputted from the cooling fluid output port 4. Thus, in each of two fluid flow paths 5, the cooling fluid 9 circulates sequentially the cooling fluid intake port 1, a flow path inside of the cooling fluid flow vessel 3 and the cooling fluid output port 4, receives heat from the double-sided heat dissipation structure 20 during going through the flow path to be heated to a high temperature, and the high temperature cooling fluid 9 is continuously outputted.

In the cooling structure according to the embodiment shown in FIG. 4 as well, a cooling structure where the contact resistance generated between the semiconductor element 11 and heat spreader 12 and the cooling fluid 9 can be made smaller and that is excellent in the heat dissipation characteristics and the long-term reliability can be obtained. Furthermore, a lightweight and compact cooling structure can be provided.

Furthermore, when, based on an existing cooling structure, a structure that dissipates heat from both surfaces is formed, since a structure is formed sandwiched by strong insulating substrates and both surfaces of a semiconductor element are strongly restrained, a force generated by the thermal stress directly works to the semiconductor element to destroy the semiconductor element and a connection portion. However, according to the heat dissipation structure according to the embodiment, since the respective heatsinks and heat spreaders are more flexibly disposed (there is no strong restraining force), the semiconductor element can be avoided from applying a large force, and thereby the destruction can be suppressed. Accordingly, when a configuration such as shown in FIG. 4 is adopted, since heat can be dissipated from two heatsinks 77, the heat dissipation characteristics can be largely improved.

In FIG. 4, a configuration where two cooling fluid flow vessels 3 sandwich a double-sided heat dissipation structure 20 is described. However, without restricting to the configuration, for instance, a configuration where in a space sandwiched by two faces of U-shaped or W-shaped cooling fluid flow vessels 3 a double-sided heat dissipation structure 20 is inserted and an aperture 10 disposed on each of the two faces is covered with a heatsink 7 of the double-sided heat dissipation structure 20 to seal may be adopted.

Embodiment 3

Figure 5A:
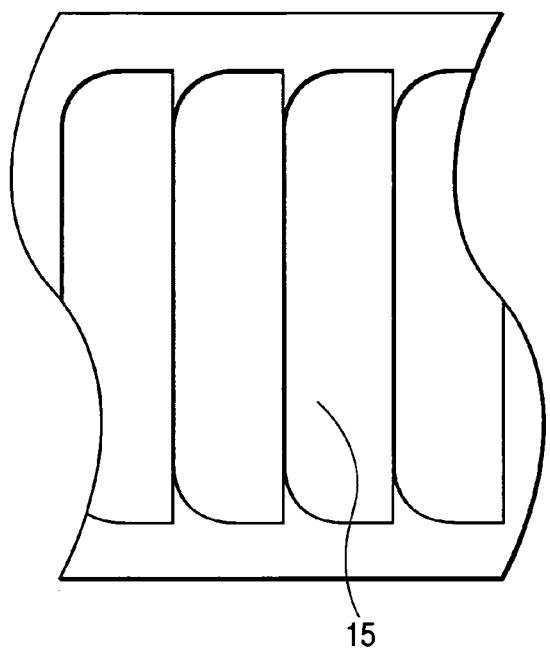
FIGS. 5A and 5B are configurational diagrams schematically showing a cooling structure according to an embodiment 3 of the invention.
Figure 5B:
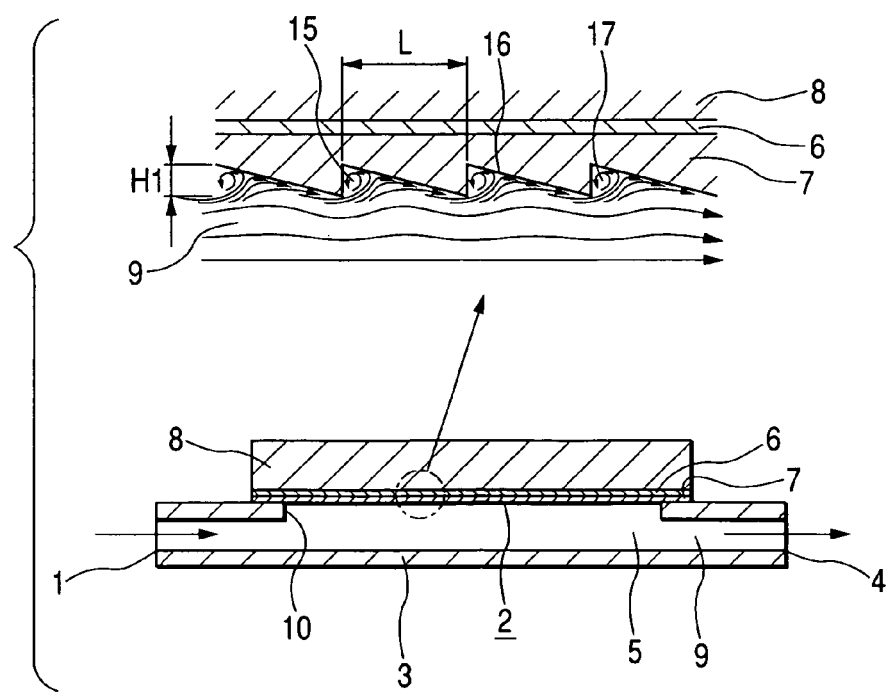

FIGS. 5A and 5B are configurational diagrams schematically showing a cooling structure according to embodiment 3 of the invention, FIG. 5A being a planar configurational diagram showing a heat transfer surface of a heatsink and FIG. 5B being a sectional configurational diagram thereof. Furthermore, in FIG. 5B, a diagram obtained by enlarging a round mark portion of a heat dissipation structure 2 is shown together.

In a cooling structure according to embodiment 3, on a surface of the heatsink of a heat dissipation structure in the embodiment 1 or 2, a sequence of fine recesses 15 having a rectangular cross section and connected in a direction that intersects with a direction of a flow of a fluid are disposed. The fine recesses 15 has an asymmetric shape in cross section along a flow direction of the cooling fluid.

In case that a recessed portion is proved on a surface where a heat is expanded, a cool fluid peels off from an upstream side thereof from the recessed portion and a retarded whirl of the cool fluid is generated. A main flow (a flow of the cool fluid flowing in a center of the flow path) of low-temperatured fluid is pulled away from the surface where the heat is expanded, so that heat exchange can be difficult and that a conduction of heat is lower.

As described above, according to the embodiment, a surface where a heat is conducted is provided with the fine recesses having an asymmetric shape in cross section along a flow direction of the cool fluid, so that a center of whirl of the cool fluid moves deeper within the fine recesses 15 and that a whirl of the cool fluid having a smaller circular shape in cross section is formed due to instability of flat whirl of the cool fluid. Accordingly, the whirl of the cool fluid easily flows into a lower portion in depth within the fine recesses 15.

Therefore, according to the embodiment, a low temperature fluid of a main stream (a flow of the cooling fluid in the center portion of the flow path) flows in the fine recess 15 and is stirred and mixed with a high temperature fluid in the fine recess 15 and pushed again in the main stream on a downstream side of the fine recess 15 to suppress a temperature boundary layer from being formed on a surface of the heatsink 7, thereby the heat transfer characteristics are improved. Accordingly, the heat dissipation characteristics of the heatsink 7 largely depend on the physicality values (values affected by the kind and temperature) of the cooling fluid 9 or the flow rate.

In this connection, under a desired shape of a fluid flow path and usage conditions (kind, temperature, pressure and flow rate of the cooling fluid 9), with a boundary layer thickness at an average temperature δ when a heatsink surface is formed smooth, with the thickness as a standard, a dimension of a fine recess 15 was studied. The results will be described below. A boundary layer thickness 6 at an average temperature when a heatsink surface is formed smooth is 0.09 mm when water at 20° C. is flowed at 1.0 m/s so as to cool in a flow path having, for instance, a flow path width of 50 mm, a flow path length of 50 mm, and a flow path height of 3 mm.

When a depth of the fine recess 15 according to the embodiment is set at H1, $(1.25 \times \delta) < H1 < $ (a thickness of the heatsink 7) has to be satisfied. In the case of $H1 \leq (1.25 \times \delta)$, only a high temperature fluid mainly of a surface layer of the heatsink 7 flows in and flows out of the fine recess 15; accordingly, a surface of the heatsink 7 is covered with the high temperature fluid, an improvement in the heat dissipation characteristics becomes difficult to obtain. Preferably, $(1.5 \times \delta) < H1 < $ (a thickness of the heatsink 7–50 μm) or $(6.0 \times \delta)$ is more desirable.

According to the embodiment, an improvement of heat conduction property is large with an increasing of δ until H1 becomes substantially equal to $(6.0 \times \delta)$. However, in case that H1 is larger than $(6.0 \times \delta)$, the improvement of heat conduction property tends to be smaller.

In general, a length in a direction of a flow of a separation portion formed in the fine recess is said substantially 5 times the depth H1 of the fine recess 15.

As describe above, according to the embodiment of the invention, the fine recesses 15 have asymmetric shape in cross section so that a peel-off portion is short. Therefore, even though a length "L" of the fine recesses 15 according to the embodiment is about 5 times the depth "H1" of the fine recess 15, a wall surface having a high heat conduction property, that is a heat-conduction surface where low-temperatured cool fluid flowing into, is existed in the fine recesses 15, the effect is obtained when L is larger than $(5.0 \times H1)$. The length L may be larger than (7.0×H1). However, the length L or the depth H1 may not be as defined above, for example, in both ends of the fine recesses 15.

When fine recesses 15 satisfying the above-mentioned dimensional conditions are disposed on a surface of the heatsink 7, since a high temperature fluid on a superficial layer of the heatsink 7 and a low temperature fluid of the main stream are agitated and mixed to be able to suppress a temperature boundary layer from developing, the heat dissipation characteristics of the heatsink can be improved.

The fine recess 15 may not be orthogonal to a direction of a flow of the cooling fluid 9. As far as the fine recess 15 has a side in a direction intersecting with an arbitrary angle with a direction of a flow of the cooling fluid 9, the similar effect can be obtained. Furthermore, the fine recess 15 may not be linearly shaped but may be shaped in an arc, meandering or zigzag shape.

Thus, in the embodiment, by forming fine recesses on the surface of the heatsink 7 along a direction intersecting with a direction of a flow of the cooling fluid a temperature boundary layer formed on the surface of the heatsink 7 is not developed, and the heat transfer characteristics can be improved. One of factors of obtaining such an effect owing to the recesses is considered present in that the fine recess causes the cooling fluid to peel and the low temperature cooling fluid collides with a heat transfer surface in the recess to cause a jet effect. Furthermore, as another factor, it is considered due to that a high temperature fluid that flows in along an inner wall surface of the recess and is heated and a low temperature fluid that directly flows in the recess from the main stream are agitated and mixed in the recess or an output portion from the recess. Which factor has a heat transfer promoting effect is different depending on a shape of the recess.

Figure 6:
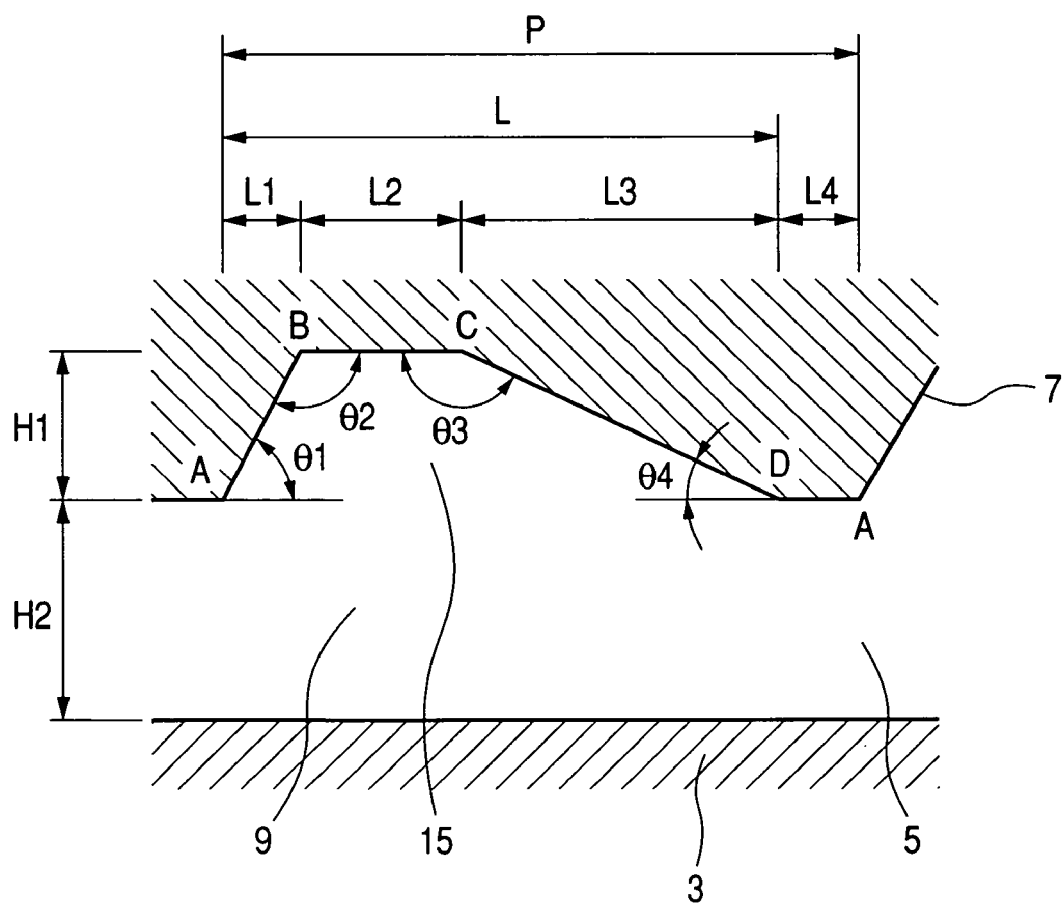
FIG. 6 is a diagram schematically showing a sectional shape of a fine recess involving the embodiment 3 of the invention.

In the next place, a cross sectional shape along a direction of a flow of the cooling fluid and in a direction in a depth of a fine recess will be described. In FIG. 6, a flow path where a fine recess 15 having a cross section of a typical anisosceles trapezoid shape is disposed is shown.

As shown in the drawing, corner portions of the fine recess 15 are taken as A, B, C and D and angles forming with a plane of the heatsink 7 at the respective corner portions are taken as $\theta_1$, $\theta_2$, $\theta_3$ and $\theta_4$. Furthermore, a disposition pitch of the fine recesses 15 is taken as P and distances between A-B, B-C, C-D and D-A sections in a plane direction of the heatsink 7 are taken as L1, L2, L3 and L4. Still furthermore, a height of the flow path and a depth of the fine recess 15, respectively, are expressed with H2 and H1. An aperture width L of the fine recess 15 can be expressed with L=L1+L2+L3.

In the beginning, the peeling of the cooling fluid 9 owing to the fine recess 15 will be described. In FIG. 6, a case where the cooling fluid 9 flows in the flow path 5 in a direction from left to right will be described.

In FIG. 6, when the peeling is caused, a corner portion A has to be peeled. When a separation portion 16 is caused, a downstream side of the separation portion 16 becomes a reattachment point 18 of the cooling fluid, and thereby the low temperature fluid of a main stream flows in. Accordingly, the heat transfer on a downstream side than the reattachment point 18 is improved to improve the heat dissipation characteristics of the heatsink 7.

As the condition of peeling, as described in a literature relating to a two-dimensional diffuser (Rnearu, L. R. et al, Trans. ASME, Ser. D, 89-1 (1967-3), P141) and a literature (Fox, R. W and Kline, S. J, Trans. ASME, Ser. D, 84-3 (1962-9), P303), when $\theta_1 >$ substantially $30°$, the peeling is caused, and, when $\theta_1 > (40 \times (L1/H2)^{1/3})°$, the separation portion is stably formed. Accordingly, in the invention, $\theta_1 > 30°$ is necessary, and, preferably, $\theta_1 > (40 \times (L1/H2)^{1/3})°$ is desirable.

As to $\theta_2$, there is no particular restriction.

An angle $\theta_3$, since a stagnation portion 17 of the cooling fluid 9 tends to be formed at a corner portion C, is desirably a wide angle ($\theta_3 > 90°$ C.).

An angle $\theta_4$ is desirably a sharp angle ($\theta_4 < 90°$ C.) corresponding to the condition of $\theta_3$.

A B-C plane and a D-A plane may not be in parallel.

Furthermore, the corner portion A desirably has an edge so as to be readily detached. However, other corner portions B, C and D are desirably formed with a curved surface so that the cooling fluid 9 may flow smoothly.

Still furthermore, in FIG. 6, each of planes that form the fine recess 15 is formed into a flat plane. However, each of these may be a curved surface having a large curvature.

From the above conditions, as a cross sectional shape of the fine recess 15, a substantial trapezoid having a large aperture and satisfying the above conditions is desirable.

Furthermore, in FIG. 6, an A-B surface is covered with the separation portion 16 to be poor in the heat dissipation characteristics. On the other hand, though a B-C surface and a D-A surface are substantially in parallel with a flow of the main stream, since the C-D surface has an arbitrary angle to a direction of a flow of the main stream, the main stream collides with the C-D surface to generate a jet effect and to be high in the heat dissipation characteristics. Accordingly, the C-D surface is most important and the longer the L3 is, the better. That is, L2=L4=0 is desirable. In this case, since the corner portions B and C coincide, the stagnation portion 17 at the corner portion C is included in the separation portion 16 and the adverse effect on the heat dissipation characteristics at the stagnation portion 17 can be eliminated; accordingly, the heat dissipation characteristics can be further improved.

From the above conditions, a sectional shape of the fine recess 15 is more desirably a substantial inequilateral triangle satisfying the above conditions.

Furthermore, the smaller the L1 is, the better, that is, L1=0 may be well (a right-angled triangle in a cross sectional shape of the fine recess 15) or L1<0 ($\theta_1 > 90°$) may be well. (However, when $\theta_1$ becomes too large, an improvement effect of the heat dissipation characteristics becomes smaller.)

An angle $\theta_4$ when a cross sectional shape is a substantial inequilateral triangle becomes, from the above conditions, $\theta_4 < 19°$ ($\theta_1 > \theta_4$).

Thus, when the cross sectional shape of the fine recess 15 is a substantial inequilateral triangle, an angle $\theta_1$ on an upstream side satisfies $\theta_1 > 30°$ and an angle $\theta_4$ on a downstream side satisfies $\theta_4 < 19°$, the separation is caused at the corner portion A on an upstream side, the main stream collides with a heat transfer surface (C-D surface) facing the corner portion A to obtain a jet effect and thereby a heatsink high in the heat dissipation characteristics can be obtained. Furthermore, in this case, since a heat transfer surface (C-D surface) on a downstream side in the fine recess 15 protrudes toward the main stream direction, a movement distance in a H1 direction until the cooling fluid 9 peeled at the corner portion A reaches a reattachment point 18 becomes shorter, and thereby a distance (length of the separation portion 16 in an L direction) in a direction of a flow up to the reattachment point becomes shorter. Accordingly, a ratio of an effective heat transfer area in an interval of the arrangement pitch P becomes larger to improve the heat dissipation characteristics.

In the next place, a heat transfer promoting effect obtained when a high temperature fluid that flows in the recess along an inner wall surface thereof and is heated to a high temperature and a low temperature fluid that directly flows in the recess from the main stream are mixed and stirred in the recess will be described. For convenience sake of description, in FIG. 6, a case where a cooling fluid 9 flows in a direction from right to left in a flow path will be described.

A high temperature fluid flowing along A-D-C-B flows in an A-B surface. On the other hand, from an aperture of the fine recess 15, a low temperature fluid of the main stream flows in an A-B surface. The respective cooling fluids collide on an A-B surface and are stirred and mixed, and thereby a temperature boundary layer formed on a surface of the heatsink 7 is inhibited from developing to improve the heat dissipation characteristics. When the heat dissipation is promoted by such a factor, firstly, the cooling fluid 9 had better flow along the D-C surface and the peeling had better not be formed at the corner portion D. Accordingly, from the conditions that do not cause the peeling, which are described in the literatures, in a configuration of FIG. 6, $\theta 4 < (25 \times (L3/H2)^{-1/2})$ is necessary to be satisfied. Preferably, in order to more stably inhibit the peeling from occurring, $\theta 4 < 12.5 \times (L3/H2)^{-1/2}$ is desirably satisfied.

An angle $\theta 3$, since a stagnation portion 17 of the cooling fluid 9 tends to be formed at the corner portion C, is desirably a wide angle ($\theta 3 > 90°$).

As to an angle $\theta 2$, there is no particular restriction.

When a low temperature fluid flows in perpendicularly to the A-B surface, since the cooling fluids are highly mixed and agitated, $\theta 1 \cong (90° - \theta 4)$ is desirably satisfied. However, it is not necessarily that an effect thereof is much deteriorated in the case of $\theta 1 < (90° - \theta 4)$.

On the other hand, the A-B surface, being a surface to which the cooling fluids collide, is excellent in the heat dissipation characteristics. However, in the case of $\theta 1 > 90°$, since a recess that stagnates the high temperature fluid is formed around the corner portion B, the heat dissipation characteristics begin to decrease.

From the above, $30° < \theta 1 < 100°$ is necessarily satisfied. Preferably, $\theta 1$ is desirably within $(90° - \theta \theta) \pm 10°$.

A B-C side and a D-A side may not be in parallel and all corner portions may be formed into curved surface. Furthermore, in FIG. 6, all surfaces that constitute the fine recess 15 are a flat surface. However, the surfaces may be curved surfaces large in the curvature.

From the above conditions, as a cross sectional shape of the fine recess 15, a substantial anisosceles trapezoid having a large aperture satisfying the above conditions is desirable ($\theta 1 > \theta 4$).

Furthermore, since, on all of surfaces of the A-D surface, D-C surface and C-B surface, the cooling fluid flows to dissipate heat, there is no need of particularly differentiating these. That is, L2=L4=0 may be well. When thus constituted, since the corner portions B and C coincide and the stagnation portions 17 generated at the corner portions B and C become one, an adverse effect on the heat dissipation characteristics in the stagnation portion 17 becomes smaller and thereby the heat dissipation characteristics can be further improved.

From the above conditions, as a cross sectional shape of the fine recess 15, a substantial inequilateral triangle satisfying the above conditions is desirable ($\theta 1 > \theta 4$).

Thus, when a cross sectional shape of the fine recess 15 is a substantial anisosceles trapezoid or a substantial inequilateral triangle and an angle $\theta 4$ on an upstream side and an angle $\theta 1$ on a downstream side satisfy $\theta 1 > \theta 4$, a high temperature fluid flowing in the recess and a low temperature fluid of the main stream collide on a heat transfer surface (A-B surface) facing the corner portion D on an upstream side to be mixed and stirred. Accordingly, a heatsink high in the heat dissipation characteristics can be obtained.

From the above description, it is found that, when a recess is shaped satisfying $\theta 1 > \theta 4$ and $\theta 1 > 30°$, irrespective of a direction where the cooling fluid flows, a heatsink high in the heat dissipation characteristics can be obtained.

In order to verify an advantage due to a configuration of the embodiment, a heat transfer test was carried out with four kinds of heatsinks different in the shape of the heat transfer surface. In a test unit, a 50 mm square aperture was disposed in a flow path having a flow path width of 50 mm and a flow path height of 2 mm, a copper heatsink was fitted to the aperture, and, from a rear surface of the heatsink, 300 W was inputted. The heatsinks evaluated were as follows: one in which a heat transfer surface in contact with the cooling fluid is formed into flat plane (standard flow path $R_0$); one in which, on a heat transfer surface of the heatsink, along a cooling fluid flow direction, a plurality of plate-like fins having a height of 2 mm and a thickness of 1.5 mm is disposed at a disposition pitch of 3.5 mm (flow path with straight fins $R_f$); one in which, on a heat transfer surface of the heatsink, a plurality of inequilateral triangular grooves (depth: 300 μm) largely recessed on an upstream side of the cooling fluid is disposed so as to be orthogonal to a flow direction of the cooling fluid at a disposition pitch of 3.5 mm (flow path $R_1$ due to the embodiment); and one in which, on a heat transfer surface of the heatsink, a plurality of inequilateral triangular grooves (depth: 300 μm) largely recessed on a downstream side of the cooling fluid is disposed so as to be orthogonal to a flow direction of the cooling fluid at a disposition pitch of 3.5 mm (flow path $R_2$ according to the embodiment 2). The cooling fluid was 50% by weight antifreeze liquid and a feed temperature was set at 70° C.

Figure 7A:
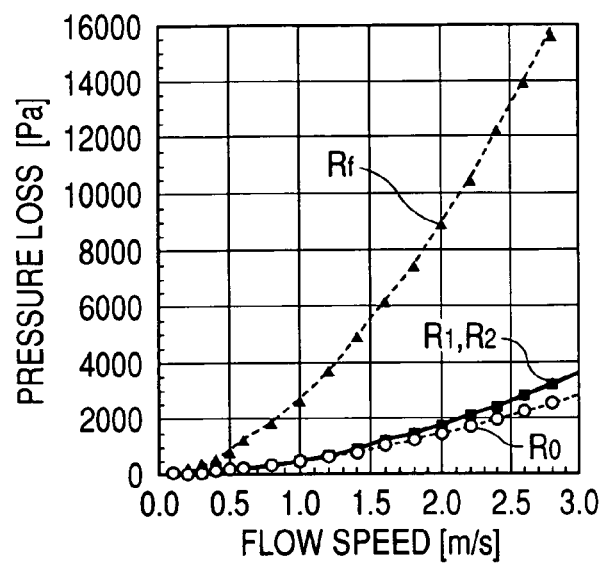
FIGS. 7A through 7C are diagrams describing comparing a cooling structure according to the embodiment 3 of the invention with an existing cooling structure.
Figure 7B:
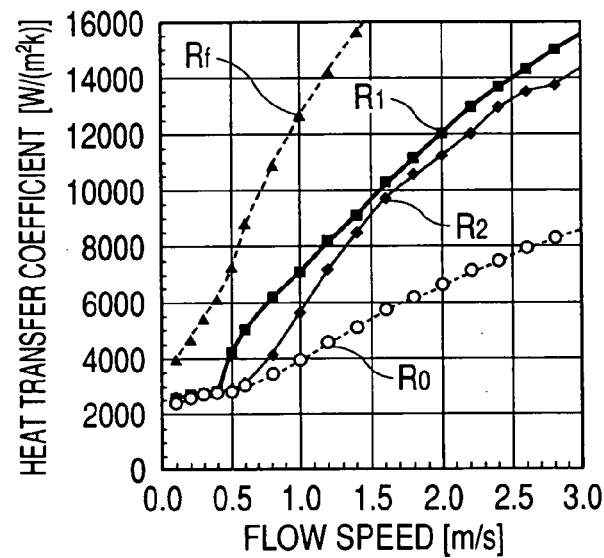
Figure 7C:
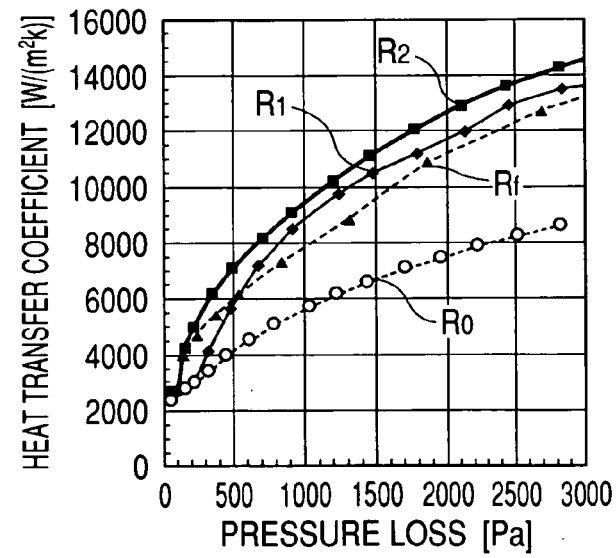

Test results are shown in FIGS. 7A through 7C. FIG. 7A shows relationship between pressure loss and flow speed. In comparison with the standard flow path $R_0$, the pressure loss of the flow path $R_f$ with straight fins is increased by substantially 6 times; however, the pressure losses of the flow paths $R_1$ and $R_2$ according to the embodiments are hardly increased.

FIG. 7B shows relationship between the coefficient of heat transfer and the flow speed. The coefficient of heat transfer of the flow path $R_f$ with straight fins is substantially 3 times that of the standard flow path Ro; however, it is smaller than a rate of increase in the pressure loss. In the case of the flow paths $R_1$ and $R_2$ according to the embodiment, when the flow speed is 0.5 m/s or less, values are substantially same as that of the standard flow path; however, when the flow speed is 0.5 m/sec or more, the coefficient of heat transfer largely increases to show such a high value as substantially 1.7 times that of the standard flow path.

In order to make a more easily understandable comparison, in FIG. 7C, relationship between the coefficient of heat transfer and the pressure loss is shown. When a comparison is made at the same pressure loss (for instance, 2000 Pa), the coefficients of heat transfer of the flow paths $R_1$ and $R_2$ according to the embodiment are substantially 1.7 times that of the standard flow path $R_0$. On the other hand, in the flow path $R_f$ with straight fins, in spite of an increase in the heat transfer area in contact with the cooling fluid to substantially 1.7 times that of the standard flow path, an increase in the coefficient of heat transfer remains at substantially 1.4 times. Furthermore, when a comparison is made at the same coefficient of heat transfer (for instance, 8000 W/(m²K), in the flow paths $R_1$ and $R_2$ according to the embodiment, the pressure losses are substantially one third that of the standard flow path $R_0$. Accordingly, when the heatsink according to the embodiment is used, targeted heat dissipation can be performed with a smaller pump.

Thus, according to a flow path configuration of the embodiment, without causing slight deterioration of the flow characteristics, only the heat transfer characteristics can be largely improved.

Furthermore, unlike the heatsink with straight fins, since there is no need of disposing a protrusion on a heat transfer surface, the flow path according to the embodiment can be readily produced to be less expensive. Still furthermore, since there is no protrusion, the protection of the protrusion becomes unnecessary during transportation and, even when the heatsink collides, the heat flow characteristics are not largely varied and the reliability is not deteriorated. Furthermore, since a transportation volume as well can be made smaller, the cost during transportation becomes smaller. Still furthermore, in an existing heatsink, a protrusion such as a fin is disposed to increase a surface area and thereby the heat transfer characteristics are improved; however, the advantage becomes smaller as a height of the flow path becomes smaller. In the flow path according to the embodiment, even when the height of the flow path becomes smaller, the advantage does not vary. Accordingly, the flow path configuration according to the embodiment is particularly advantageous when the height of the flow path is smaller.

Furthermore, since the case of low flow speed (in the experiment, a case where the flow speed is smaller than 0.5 m/sec) is a laminar flow region, a remarkable advantage of the invention such as shown above could not be obtained. The embodiment is particularly advantageous in a turbulent flow region (in the experiment, a case where the flow speed is 0.5 m/s or more). As the depth H1 of the fine recess 15 becomes larger, the critical flow speed transferring from the laminar flow region to the turbulent flow region becomes smaller (reaching the turbulent flow region even at a smaller flow speed).

Figure 9A:
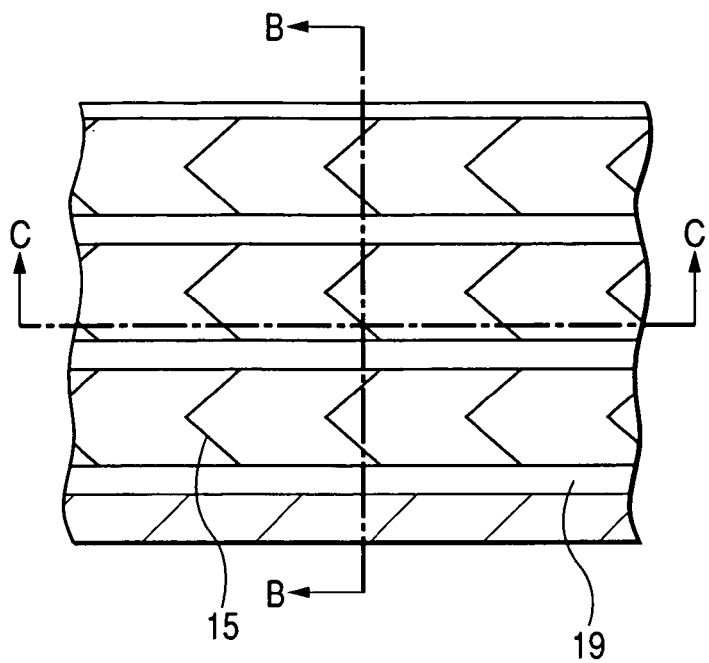
FIGS. 9A through 9C are configurational diagrams schematically showing still another cooling structure according to the embodiment 3 of the invention.
Figure 9B:
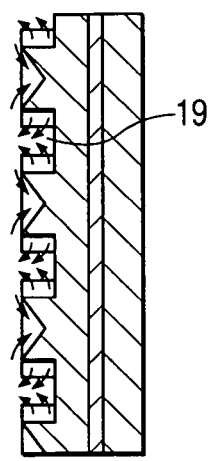
Figure 9C:
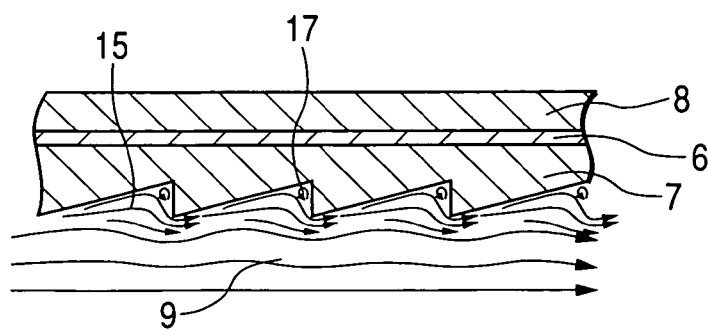

In the embodiment, a high temperature fluid in a fine recess 15 is pushed out toward a downstream side. However, when, as a further heat transfer promoting method, as shown in FIGS. 8A through 8C and 9A through 9C, to the fine recess 15, a bypass groove 19 is disposed along a direction of a flow of the cooling fluid and the high temperature fluid in the fine recess 15 is efficiently pushed out in the bypass groove 19, a thickness of a temperature boundary layer in the fine recess 15 can be made smaller. According to the configuration, the heat dissipation characteristics may be improved. FIGS. 8A and 9A each show a planar configurational diagram of a heat transfer surface of a heatsink and FIGS. 8B and 9B each show a sectional configurational diagram along a B-B line of each of FIGS. 8A and 9A. Furthermore, FIGS. 8C and 9C each show a sectional configurational diagram along a C-C line of each of FIGS. 8A and 9A, and a flow of the cooling fluid is shown together.

When thus configured, since an output port from which the high temperature fluid in the fine recess 15 flows out is made larger, the high temperature fluid is efficiently flowed out, and thereby the heat dissipation characteristics can be improved. In particular, since the high temperature fluid in the separation portion 16 and the stagnation portion 17 is readily exhausted, an effective heat transfer area is increased and thereby the heat transfer characteristics can be more improved.

A shape of the bypass groove 19 may be a rectangle or a triangle in the cross sectional shape thereof. That is, a shape and dimension thereof are not particularly restricted.

Furthermore, in order to improve the heat seal characteristics, a peripheral portion of the heatsink 7 had better not be disposed with a fine recess 15.

Still furthermore, in one heatsink 7, a plurality of different shapes (patterns) of fine recesses 15 may be formed.

Furthermore, a heat seal portion in the periphery of the heatsink 7 and a heat dissipation portion in the center thereof, that is, portions that come into contact with the cooling fluid 9, are not necessary to be on the same surface. An arbitrary step may be disposed between the seal portion and the heat dissipation portion.

Embodiment 4

Figure 10:
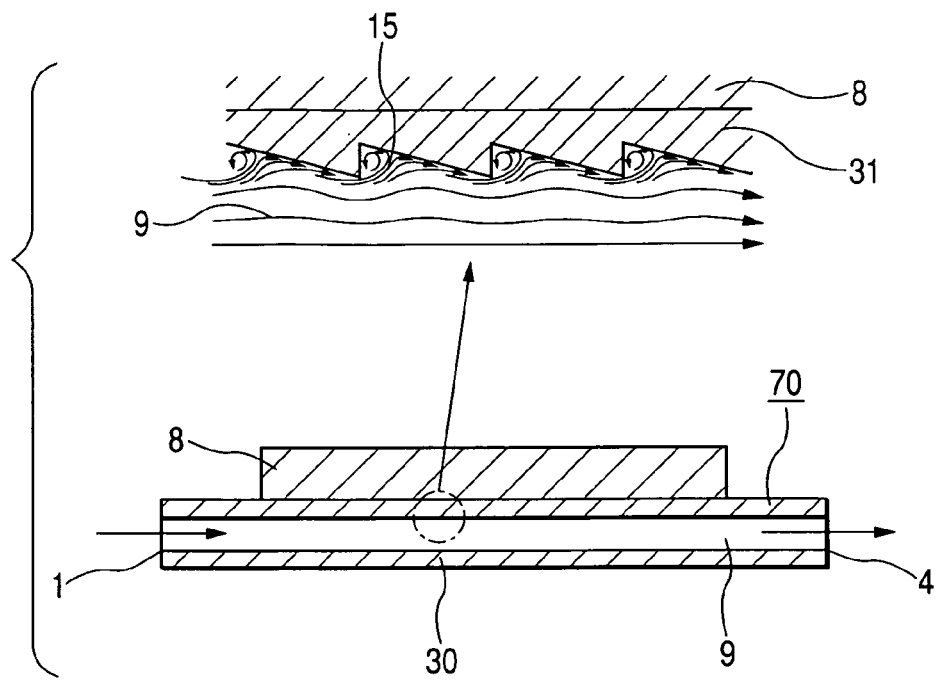
FIG. 10 is a sectional configurational diagram schematically showing a heatsink according to an embodiment 4 of the invention.

FIG. 10 is a sectional configurational diagram schematically showing a heatsink according to an embodiment 4 of the invention. In FIG. 10, an enlarged diagram of a round mark portion of the heatsink is shown together.

A heatsink 70 according to the embodiment 4, as shown in FIG. 10, includes a cooling fluid intake port 1, a heat transfer vessel 30 in which a flow path is formed and a cooling fluid output port 4, an inner surface wall of the flow path of the heatsink 70 being provided with fine recesses 15 described in the embodiment 3. An improvement effect in the heat dissipation characteristics due to the fine recesses 15, which was described in the embodiment 3, as obvious from experimental results shown in FIG. 7, is not specific to the configuration where, in a heatsink made of a flexible metal foil, the fine recesses 15 are disposed but also effective in the case where the fine recesses 15 are disposed on an arbitrary heat transfer surface.

The fine recess 15 stirs and mixes only a cooling fluid of a superficial layer of an inner wall surface of the heatsink 70 to inhibit a temperature boundary layer from developing and does not disturb a flow of the main stream; accordingly, an increase in the pressure loss is less. As a result, without making a weight and volume of the heatsink larger, the heat dissipation characteristics of the heatsink can be improved.

Furthermore, the fine recess 15 like this, in addition to having more excellent heat transfer characteristics, is not heavy and easy to produce in comparison with one where a protrusion such as a fin is disposed on a heat transfer surface to increase a heat transfer area.

The heat transfer vessel 30 of the heatsink 70 of the embodiment is provided with a heat generator 80 and a cooling fluid 9 is flowed in a flow path in the heat transfer vessel 30, and thereby a cooling structure that cools the heat generator 8 is formed. The heat generator 8, as far as it can input heat to the heatsink 70 without supplying electricity to the heatsink 70, is not restricted in the structure, shape and dimension. Furthermore, between the heat generator 8 and the heat transfer vessel 30, a contact thermal resistance reducing agent such as thermal grease may be coated.

Still furthermore, the heatsink 70 may be formed of a plurality of divided components.

Figure 11:
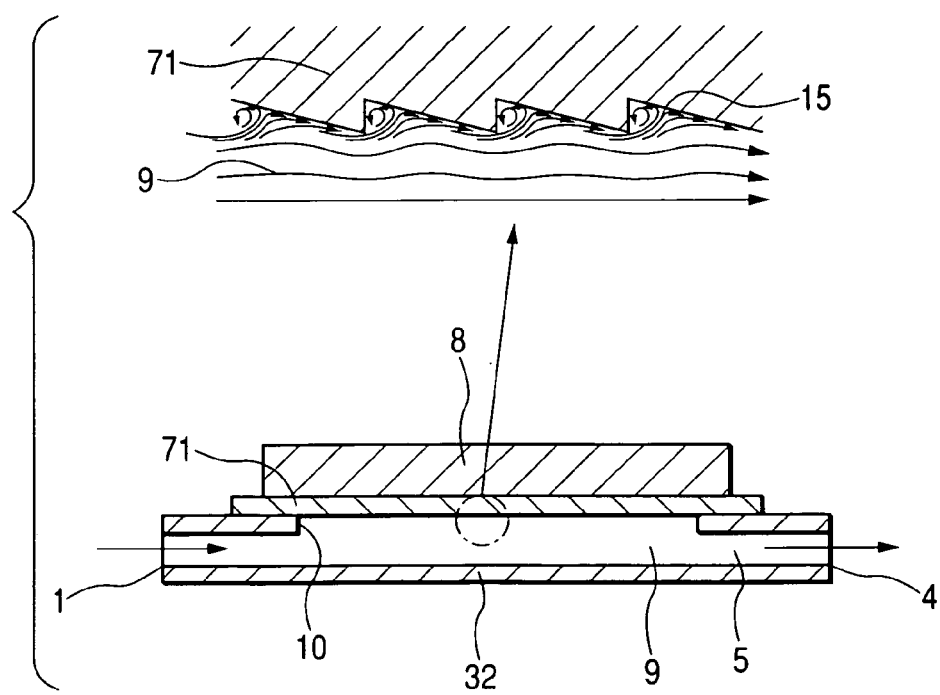
FIG. 11 is a sectional configurational diagram schematically showing another heatsink according to the embodiment 4 of the invention.

FIG. 11 is a sectional configurational diagram schematically showing another heatsink according to embodiment 4 of the invention. In a fluid flow path 5 made of a cooling fluid intake port 1, a cooling fluid flow vessel 32 inside of which a flow path is formed and a cooling fluid output port 4, an aperture 10 communicating between the flow path in the cooling fluid flow vessel 32 and a periphery thereof is disposed, and, with a plate-like heatsink 71 provided with a fine recess 15 described in the embodiment 3, the aperture 10 is covered and sealed. At that time, the heatsink 71 is disposed so that a surface thereon the fine recesses 15 are disposed may directly come into contact with the cooling fluid 9 in the fluid flow path 5 and, on a rear surface of the heatsink 71, a heat generator 8 is disposed.

In this case, between the heat generator 8 and the heatsink 71, a contact thermal resistance reducing agent such as thermal grease may be coated or the heat generator 8 and the heatsink 71 may be fastened with a solder.

Furthermore, the heatsink 71 may be constituted of a substrate and a heatsink fastened (adhered, soldered) to the substrate and made of a flexible metal foil, and the heatsink made of the metal foil may be provided with the fine recesses 15 on a surface of the heatsink.

Figure 12A:
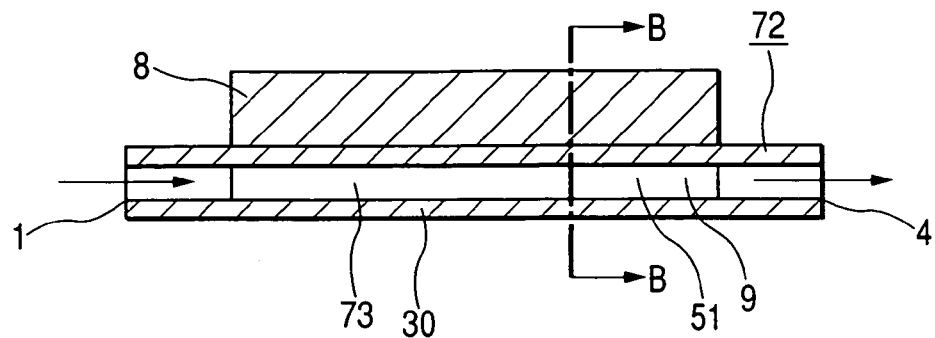
FIGS. 12A and 12C are configurational diagrams schematically showing another heatsink according to the embodiment 4 of the invention.
Figure 12B:
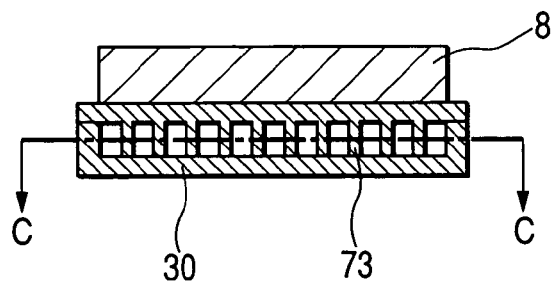
Figure 12C:
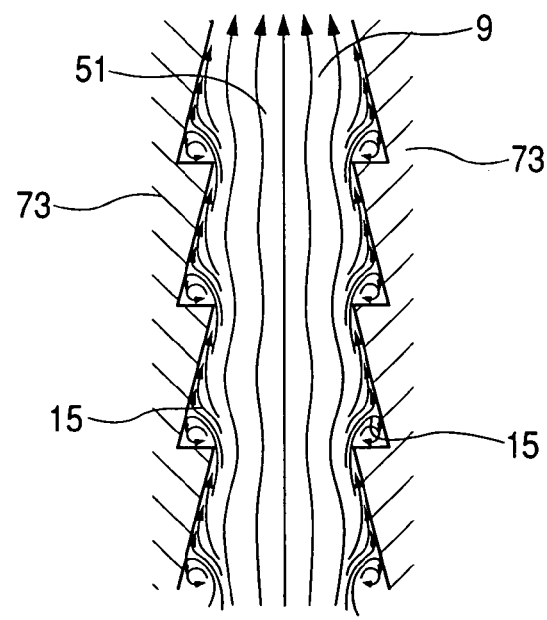

FIGS. 12A through 12C are configurational diagrams schematically showing still another heatsink according to the embodiment 4 of the invention, FIG. 12B being a sectional configurational diagram cut at a B-B line of FIG. 12A, FIG. 12C being a diagram showing by partially enlarging a section cut at a C-C line of FIG. 12B.

In FIGS. 12A through 12C, on a heat transfer surface of a heatsink 72, a plurality of fins 73 is disposed, and, inside of a heat transfer vessel 30 of the heatsink 72, a plurality of flow paths 51 is formed. Furthermore, on a surface of a fin 73, fine recesses 15 described in the embodiment 3 are disposed.

Even when thus configured, in addition to an advantage of disposing fins 73, an advantage of disposing the fine recesses 15 is added; accordingly, a heatsink excellent in the heat dissipation characteristics can be obtained.

In FIGS. 12A through 12C, on a heat transfer inner wall surface provided with the fins 73, the fine recesses 15 may be disposed.

Figure 13A:
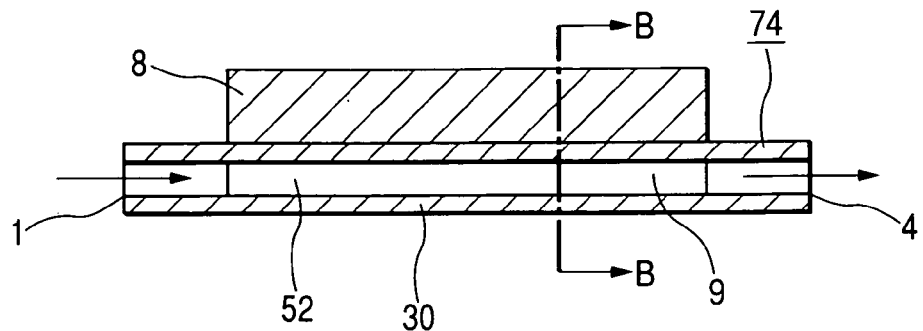
FIGS. 13A and 13C are configurational diagrams schematically showing still another heatsink according to the embodiment 4 of the invention.
Figure 13B:
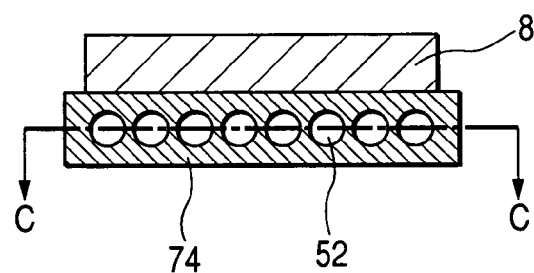
Figure 13C:
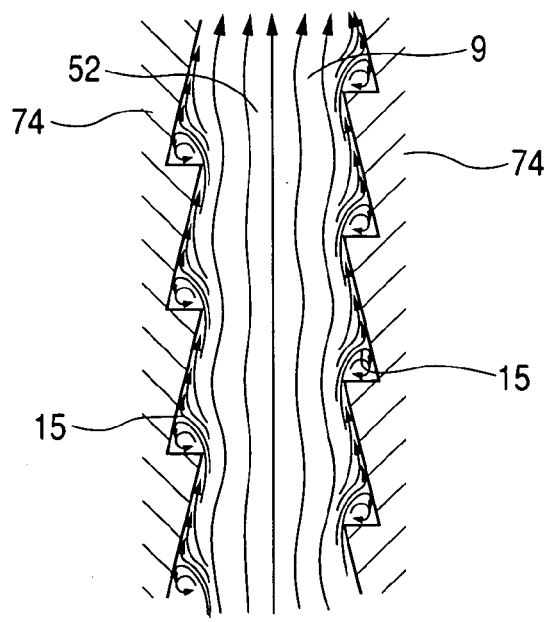

FIGS. 13A through 13C are configurational diagrams schematically showing further still another heatsink according to the embodiment 4 of the invention, FIG. 13B being a sectional configurational diagram cut at a B-B line of FIG. 13A, FIG. 12C being a diagram showing by partially enlarging a section cut at a C-C line of FIG. 13B.

In FIGS. 13A through 13C, inside of the heat transfer vessel 30 that constitutes a heatsink 74, one or a plurality of circular flow paths 52 is disposed and an inner wall surface of the flow path is provided with the fine recesses 15 described in the embodiment 3.

The fine recess 15 may be continuous one having both ends thereof. The fine recess having a loop-shape may extend along a cross section of the flow path. The fin recess having a helical shape may go around the flow path.

In the case of such a configuration, in particular, by screw cutting, the fine recesses 15 can be readily formed on an inner wall surface in the flow path.

Furthermore, a heatsink small in an increase in the pressure loss and improved in the heat dissipation characteristics can be provided.

In FIGS. 12A through 12C, an example where tip end positions of the fine recesses 15 disposed on facing surfaces of the fin 73 are disposed in a matching manner is shown. However, as shown in FIGS. 13A through 13C, tip end positions of the fine recesses 15 disposed on facing surfaces may be disposed displaced.

Furthermore, in each of the heatsinks of the respective configurations shown in the embodiment 4 as well, the fine recess 15 disposed on a surface in contact with the cooling fluid may be a sequence of recesses connected in a direction traversing a flow of the cooling fluid 9, a fine recess having a cross sectional shape in a depth direction along a direction of a flow of the cooling fluid 9 having a substantially trapezoid or a substantially inequilateral triangle being preferably disposed.

Furthermore, the fine recess 15 may be configured with a bypass groove 19.

Embodiment 5

Figure 14:
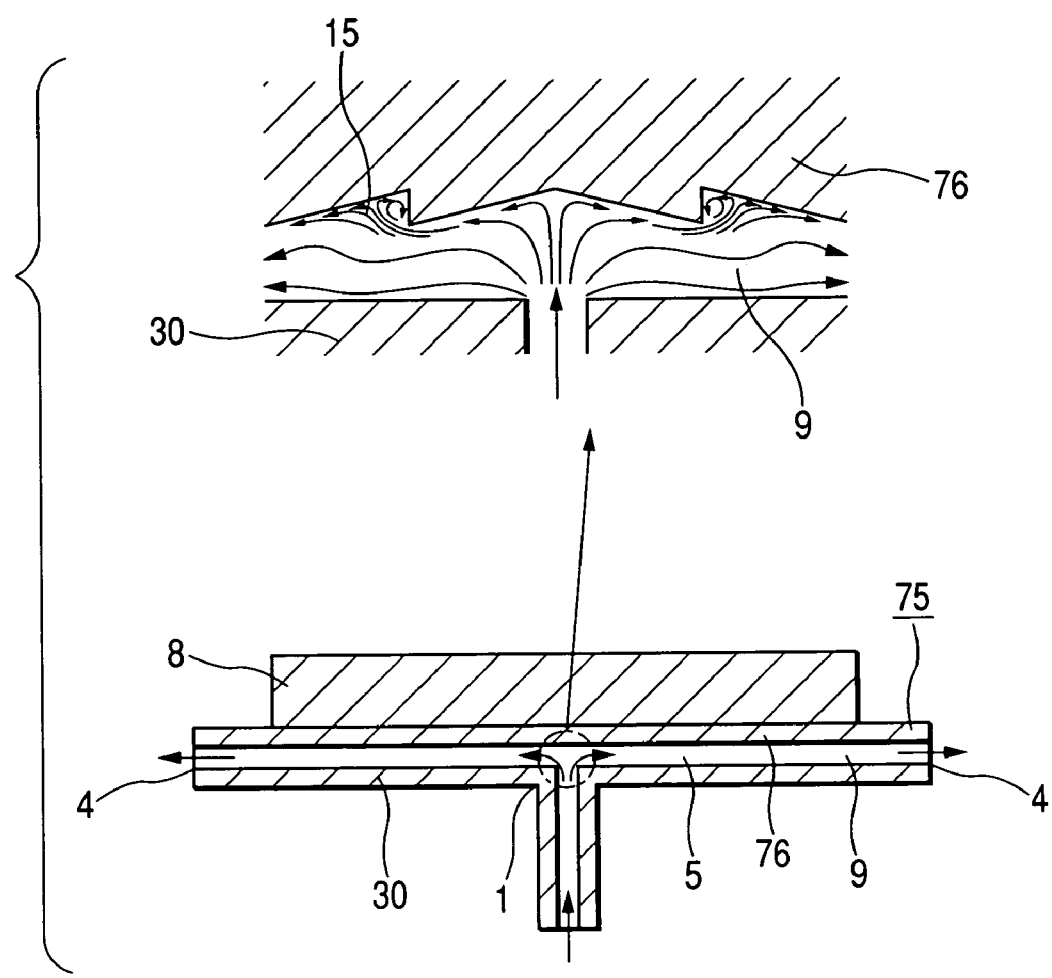
FIG. 14 is a sectional configurational diagram schematically showing a heatsink according to an embodiment 5 of the invention.

FIG. 14 is a sectional configurational diagram schematically showing a heatsink according to embodiment 5 of the invention. In FIG. 14, an enlarged diagram of a round mark portion of the heatsink is shown together.

In a heatsink 75 according to the embodiment 5, as shown in FIG. 14, a cooling fluid intake port 1 through which the cooling fluid 9 is fed is disposed so as to face a substantial center portion of a heat transfer surface 76 of the heatsink, the heat transfer surface 76 of the heatsink being provided with fine recesses 15 described in the embodiment 3.

In general, since a heat generator 8 has a configuration where a heat generation source is disposed at a center of the heat generator or a center of a heat generator has a configuration that can readily accumulate heat, when the center of the heat generator is cooled with a lower temperature cooling fluid 9, the heat dissipation characteristics are better. However, when, simply, a cooling fluid intake port 1 is disposed facing a center of the heat transfer surface 76 and the cooling fluid 9 is fed from the intake port 1, on the heat transfer surface 76 in the vicinity of the cooling fluid intake port 1, high heat transfer promotion effect can be obtained owing to the collision jet; however, in the periphery of the heat transfer surface 76, since a temperature boundary layer is thick to be poor in the heat dissipation characteristics, the heat dissipation characteristics of the heatsink as a whole are not so good.

In this connection, in the embodiment, the fine recesses 15 described in the embodiments are disposed on the heat transfer surface 76 to suppress a temperature boundary layer from developing, and thereby the heat dissipation characteristics are improved. Thereby, the heat dissipation characteristics of the heatsink as a whole are further improved.

In particular, when the fine recesses 15 are disposed, with respect to a position of the cooling fluid intake port 1, the fine recesses 15 are disposed so as to be axisymmetric or form a multi-circle or a spiral. Thereby, the heat dissipation characteristics in the periphery of the cooling fluid intake port are improved and the heat dissipation characteristics of the heatsink as a whole are improved.

The fine recess 15 may be formed into a flower pedal like multi-circle or a spiral.

Furthermore, on a surface facing the heat transfer surface 76 a protrusion that guides a flow of the cooling fluid 9 may be disposed. When the protrusion causes a squeezing, turning or turbulent flow, the heat dissipation characteristics can be further improved.

Still furthermore, in the embodiment 4, a plate-like heatsink is described. However, when the heatsinks 7 in the cooling structure shown embodiment 1 or 2 as well are similarly configured, an advantage same as that of the embodiment can be obtained.

What is claimed is:

1. A cooling structure that cools heat generated from a heat generator with a cooling fluid, the cooling structure comprising:
    a heat dissipation structure including:
    a heat generator comprising a semiconductor element;
    a first heat spreader and a second heat spreader disposed on opposite surfaces of the semiconductor element;
    a first heat sink attached to a surface of the first heat spreader on a side of the first heat spreader opposite to the semiconductor element, the first heat sink including a first flexible metal foil and adhered to the first heat spreader via a first insulating adhesive layer, the first flexible metal foil being impermeable to the cooling fluid;

a second heat sink attached to a surface of the second heat spreader on a side of the second heat spreader opposite to the semiconductor element, the second heat sink including a second flexible metal foil and adhered to the second heat spreader via a second insulating adhesive layer, the second flexible metal foil being impermeable to the cooling fluid; and a flow path structure disposed outside of the heat dissipation structure, the flow path structure comprising:

a first fluid flow path disposed on a side of the first heat sink opposite to the semiconductor element so that the cooling fluid flowing inside the first fluid flow path and the first heat sink directly come into contact; and a second fluid flow path disposed on a side of the second heat sink opposite to the semiconductor element so that the cooling fluid flowing inside the second fluid flow path and the second heat sink directly come into contact, the first fluid flow path and the second fluid flow path both including a cooling fluid intake port, a cooling fluid flow path vessel provided with a flow path inside thereof, an aperture, and a cooling fluid output port, wherein the heat dissipation structure is disposed so that the first heat sink covers the aperture of the first fluid flow path and the second heat sink covers the aperture of the second fluid flow path, wherein no further heat generator is positioned between said heat generator comprising a semiconductor element and either of said first heat spreader and said second heat spreader.

2. The cooling structure according to claim 1,
wherein a fine recess intersects with a flow direction of the cooling fluid and is disposed on a surface of the first heatsink that directly comes into contact with the cooling fluid, and
wherein, when viewed from a cross section of the fine recess along the flow direction of the cooling fluid, the fine recess is asymmetrical.

3. The cooling structure according to claim 1, wherein a fine recess intersects with a flow direction of the cooling fluid and is disposed on a surface of the first heatsink that directly comes into contact with the cooling fluid, and
wherein the fine recess includes a first area in which the cooling fluid flows and a second area in which the cooling fluid flows, the first area being greater than the second area.

4. The cooling structure according to claim 2, wherein a shape of the fine recess in a cross section along a flow direction of the cooling fluid is identical to a shape of the fine recess in a cross section along a direction intersecting with the flow direction of the cooling fluid.

5. The cooling structure according to claim 2, wherein the fine recess is deeper at an upstream side than at a downstream side.

6. The cooling structure according to claim 2, further comprising a bypass groove disposed along the flow direction of the cooling fluid and connected with the fine recess.

* * * * *